US011741882B2

(12) United States Patent
Xiang et al.

(10) Patent No.: US 11,741,882 B2
(45) Date of Patent: Aug. 29, 2023

(54) PIXEL CIRCUIT FOR ADJUSTING MAXIMUM BRIGHTNESS FOR ORGANIC LIGHT-EMITTING DISPLAY PANEL, AND ORGANIC LIGHT-EMITTING DISPLAY PANEL

(71) Applicants: Shanghai Tianma AM-OLED Co., Ltd., Shanghai (CN); WUHAN TIANMA MICROELECTRONICS CO., LTD. SHANGHAI BRANCH, Shanghai (CN)

(72) Inventors: Dongxu Xiang, Shanghai (CN); Yue Li, Shanghai (CN); Renyuan Zhu, Shanghai (CN); Yana Gao, Shanghai (CN); Zhonglan Cai, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/565,486

(22) Filed: Dec. 30, 2021

(65) Prior Publication Data

US 2022/0122518 A1 Apr. 21, 2022

Related U.S. Application Data

(63) Continuation of application No. 15/886,858, filed on Feb. 2, 2018, now abandoned.

(30) Foreign Application Priority Data

Aug. 14, 2017 (CN) ........................ 201710690526.0

(51) Int. Cl.
*G09G 3/22* (2006.01)
*G09G 3/3233* (2016.01)
(Continued)

(52) U.S. Cl.
CPC ............. *G09G 3/22* (2013.01); *G09G 3/3233* (2013.01); *G09G 3/3266* (2013.01); *H10K 59/10* (2023.02);
(Continued)

(58) Field of Classification Search
CPC ........................................................ G09G 3/22
See application file for complete search history.

(56) References Cited

U.S. PATENT DOCUMENTS

2008/0079670 A1* 4/2008 Asano .................... G09G 3/325 345/77
2008/0303847 A1* 12/2008 Asano ................. G09G 3/2029 345/76

(Continued)

*Primary Examiner* — William Boddie
*Assistant Examiner* — Andrew B Schnirel
(74) *Attorney, Agent, or Firm* — KILPATRICK TOWNSEND & STOCKTON LLP

(57) ABSTRACT

Provided are an organic light-emitting display panel, a driving method and a driving device therefor. The driving method includes: setting brightness levels of the organic light-emitting display panel and maximum gray scale brightness levels, and maximum gray scale brightness levels include a first maximum gray scale brightness corresponding to a maximum brightness level of the organic light-emitting display panel, and an effective pulse duty cycle of a light-emitting control signal for driving the first maximum gray scale brightness is defined as a first effective pulse duty cycle; determining a target brightness level of the switched picture and a target maximum gray scale brightness corresponding to the target brightness level; adjusting the target effective pulse duty cycle of the light-emitting control signal for driving the switched picture.

12 Claims, 8 Drawing Sheets

(51) Int. Cl.
*G09G 3/3266* (2016.01)
*H10K 59/10* (2023.01)

(52) U.S. Cl.
CPC ............... *G09G 2300/0819* (2013.01); *G09G 2300/0842* (2013.01); *G09G 2300/0861* (2013.01); *G09G 2300/0866* (2013.01); *G09G 2310/0262* (2013.01); *G09G 2310/0264* (2013.01); *G09G 2310/0286* (2013.01); *G09G 2320/0626* (2013.01)

(56) References Cited

U.S. PATENT DOCUMENTS

2009/0201286 A1* 8/2009 Hasegawa ............ G09G 3/3258 345/84
2015/0200239 A1* 7/2015 Jung ................... H01L 27/3258 257/40
2016/0125798 A1* 5/2016 Park ..................... G09G 3/3233 345/204
2017/0365214 A1* 12/2017 Tsai ..................... G09G 3/3233

* cited by examiner

PIXEL CIRCUIT FOR ADJUSTING MAXIMUM BRIGHTNESS FOR ORGANIC LIGHT-EMITTING DISPLAY PANEL, AND ORGANIC LIGHT-EMITTING DISPLAY PANEL

CROSS-REFERENCE TO RELATED APPLICATIONS

This application is a continuation application of U.S. patent application Ser. No. 15/886,858 filed on Feb. 2, 2018, which claims priority to Chinese patent application No. 201710690526.0 filed on Aug. 14, 2017, the disclosure of which is incorporated herein by references in their entireties.

FIELD

The present disclosure relates to display technologies, in particular to an organic light-emitting display panel, a driving method and a driving device therefor.

BACKGROUND

As the next generation display device, an organic light-emitting display device raises the wide concerns due to its characteristics such as self-luminance, fast response, wide viewing angle and the preparation for a flexible screen etc. An organic light-emitting diode (OLED) display device is a current-driven active light-emitting display device and may be divided as a passive-matrix organic light-emitting diode (PM-OLED) display device and an active-matrix organic light-emitting diode (AM-OLED) display device based on the driving manner.

At present, most of the OLED display devices employ a shift register device to control the generation of light-emitting signals (hereinafter, referred to as EMIT), and two rows of pixels may be driven by a cascade of the shift registers device. The conventional OLED display device commonly has 256-levels brightness (0-255), and the shift register device thereof commonly employs a light-emitting control timing with four pulses. In order to avoid the flickers, a time period of a frame is commonly divided into quarters, in order to enable each quarter of the time period to achieve a 256-levels brightness variation to avoid the flickers. However, for the conventional OLED display devices, a 256-levels brightness variation in each quarter of the time period may not be achieved, that is, a jumping occurs in the brightness variation of the display device, which leads to an unsmooth brightness variation of the display device, and the display effect of the OLED display device is affected.

SUMMARY

The present disclosure provides an organic light-emitting display panel, a driving method and a driving device therefor.

In a first aspect, the present disclosure provides an driving method for the organic light-emitting display panel, and the driving method includes:

setting brightness levels of the organic light-emitting display panel and maximum gray scale brightness levels, each of the brightness levels corresponds to a respective one of maximum gray scale brightness levels, maximum gray scale brightness levels include a first maximum gray scale brightness corresponding to a maximum brightness level of the organic light-emitting display panel, and an effective pulse duty cycle of a light-emitting control signal (EMIT) for driving the first maximum gray scale brightness is defined as a first effective pulse duty cycle;

determining, when a picture in the organic light-emitting display panel is controlled to be switched, a target brightness level of the switched picture and a target maximum gray scale brightness corresponding to the target brightness level;

adjusting, based on the target maximum gray scale brightness of the switched picture, the first maximum gray scale brightness and the first effective pulse duty cycle, the target effective pulse duty cycle of the EMIT for driving the switched picture.

In a second aspect, the present disclosure provides a driving device for the organic light-emitting display panel, and the driving device includes:

a display brightness determining device, which is configured to determine, when controlling the picture switching of the organic light-emitting display panel, the target brightness level of the switched picture and the target maximum gray scale brightness corresponding to the target brightness level;

a display brightness adjusting device, which is configured to adjust the target effective pulse duty cycle of the EMIT for driving the switched picture on the basis of the target maximum gray scale brightness of the switched picture, the first maximum gray scale brightness and a first duty cycle, the maximum gray scale brightness corresponding to the maximum brightness level of the organic light-emitting display panel is defined as a first maximum gray scale brightness, and the effective pulse duty cycle of the EMIT for driving the first maximum gray scale brightness is defined as a first effective pulse duty cycle.

Moreover, the present disclosure provides an organic light-emitting display panel, and the organic light-emitting display panel includes the above mentioned driving device.

BRIEF DESCRIPTION OF DRAWINGS

A simple description about the drawings employed in the embodiments of the present disclosure is given as below.

DETAILED DESCRIPTION

Figure 1:
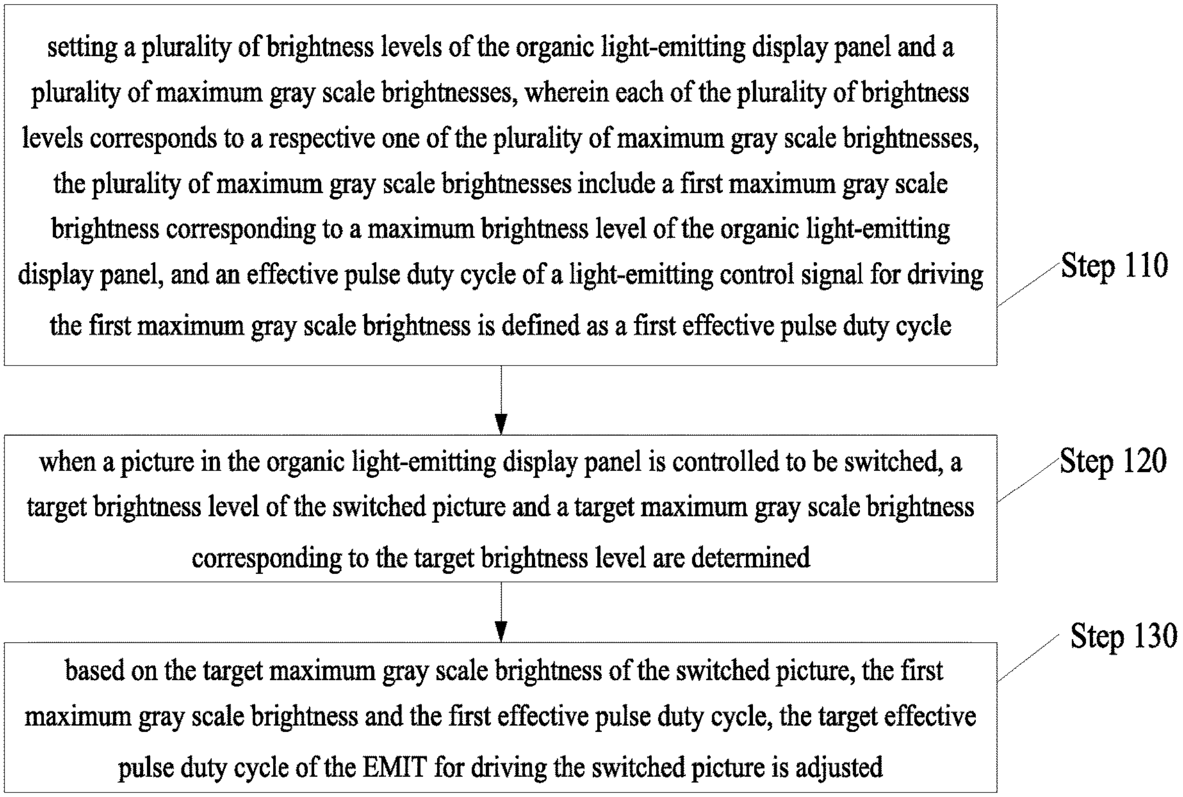
FIG. 1 is a flow diagram showing a driving method for an organic light-emitting display panel according to an embodiment of the present disclosure.

Referring to FIG. 1, FIG. 1 is a flow diagram showing a driving method for an organic light-emitting display panel according to an embodiment of the present disclosure. The driving method for the organic light-emitting display panel includes: Step 110, setting brightness levels of the organic light-emitting display panel and multiple maximum gray scale brightness levels, and each of brightness levels corresponds to a respective one of maximum gray scale brightness levels, maximum gray scale brightness levels include a first maximum gray scale brightness corresponding to a maximum brightness level of the organic light-emitting display panel, and an effective pulse duty cycle of a light-emitting control signal (hereinafter, referred to as EMIT) for driving the first maximum gray scale brightness is defined as a first effective pulse duty cycle.

In this embodiment, the brightness level of the organic light-emitting display panel and the maximum gray scale brightness corresponding to the brightness level may need be set before the organic light-emitting display panels leave the factory. Since the light-emitting organic display panels in the prior art generally employ an 8-bits shift register to control the pixels to emit light, the light-emitting organic display panel of this embodiment may have a 256-levels brightness (0-255), and each brightness level is configured to have a minimum gray scale brightness and a maximum gray scale brightness. The minimum gray scale brightness of each brightness level is zero, and different brightness levels have different maximum gray brightness thereof, and the higher the brightness level is, the higher the maximum gray scale brightness corresponding to the brightness level is. Apparently, the maximum gray scale brightness corresponding to the maximum brightness level of the organic light-emitting display panel has a maximum brightness of the organic light-emitting display panel, Therefore, the maximum gray scale brightness corresponding to the maximum brightness level of the organic light-emitting display panel is defined as a first maximum gray scale brightness.

The brightness of each brightness level of the organic light-emitting display panel in this embodiment may be divided into a 256-levels gray scale (0-255). Therefore, for any of brightness levels of the organic light-emitting display panel, the 255-th-level gray scale brightness corresponding to the brightness level has the maximum gray scale brightness of the brightness level. For example, the maximum gray scale brightness corresponding to the 240-th-level brightness is 350 nit, and the maximum gray scale brightness corresponding to the 255-th-level brightness is 400 nit.

In this embodiment, brightness levels of the organic light-emitting display panel and the maximum gray scale brightness corresponding to each of the brightness levels are set before the organic light-emitting display panels leaves the factory. It should be noted that, the inputted voltage potential of a gate electrode of a thin film transistor (TFT) for driving an organic light-emitting diode (OLED) may be adjusted by adjusting the data signal voltage, and the gate-source voltage of the TFT is changed, and controlling the magnitude of the current flowing through the OLED, which in turn changes the luminous intensity of the OLED. And, the data signal voltage corresponding to a gray scale level of the brightness level may be determined, that is, when the brightness level of the organic light-emitting display panel is determined, the desired gray level of each pixel may be achieved by adjusting the data signal voltage.

In this embodiment, the effective pulse of the EMIT is configured to control the at least one row of corresponding sub-pixels to emit light, and the organic light-emitting display panel includes light-emitting control lines, a light-emitting control line corresponds to and is electrically connected to at least one row of the corresponding sub-pixels, and hence the EMIT outputted by the light-emitting control line controls at least one row of corresponding sub-pixels to emit light.

In one embodiment, the EMIT is configured to control the turning on and off of each light-emitting control transistor for driving the OLED in the at least a row of pixel circuits corresponding thereto. When the EMIT turns on the light-emitting transistor, the OLED emits light. When the EMIT turns off the light-emitting transistor, the OLED does not emit light. Therefore, the EMIT can control the light-emitting time period of the OLED, the longer of the light-emitting time period is, the higher brightness of the OLED is.

Apparently, the EMIT may change the brightness level of the OLED by adjusting the length of the light-emitting time period. The pulse of the EMIT for controlling the turning on of the light-emitting control transistor is defined as an effective pulse. On the contrary, the pulse of the EMIT for controlling the turning off of the light-emitting control transistor is defined as an ineffective pulse. The ratio of the effective pulse duration of a light-emitting control cycle to the light-emitting control cycle is defined as an effective pulse duty cycle. In this embodiment, the effective pulse duty cycle of the EMIT for driving the first maximum gray scale brightness is defined as a first effective pulse duty cycle. The effective pulse duty cycle of the EMIT for driving other gray scale brightness is certainly less than the first effective pulse duty cycle.

In this embodiment, the effective pulse of the EMIT is configured to control the adjacent two rows of sub-pixels to emit light. That is, the organic light-emitting display panel includes light-emitting control lines, and each of the light-emitting control lines is electrically connected to adjacent two rows of sub-pixels. In other embodiments, the effective pulse of the EMIT is also configured to control the adjacent four rows of sub-pixels to emit light.

In one embodiment, an output waveform of the EMIT includes effective pulses and ineffective pulses. By employing the effective pulse and ineffective pulse to alternately control turning on and off of the light-emitting control transistor of the OLED for driving the pixel circuit, the power consumption of the organic light-emitting display panel is reduced.

In one embodiment, different organic light-emitting display panels may have different light-emitting control circuits, and the number of brightness levels for different organic light-emitting display panels may be different. The number of brightness levels of the organic light-emitting display panel is not limited in the present disclosure.

Step 120, when a picture in the organic light-emitting display panel is controlled to be switched, a target brightness level of the switched picture and a target maximum gray scale brightness corresponding to the target brightness level are determined.

In this embodiment, when a picture in the organic light-emitting display panel is to be switched, a target brightness level of the switched picture may need be determined by the organic light-emitting display panel. It should be noted that, if the user does not adjust the brightness level of the organic light-emitting display panel, the target brightness level of the switched picture conforms with brightness level of the picture of current frame; if the user adjusts the brightness level of the organic light-emitting display panel, the adjusted brightness level is the target brightness level of the switched picture. When the maximum brightness level of organic light-emitting display panel corresponding to each of the brightness levels and the target brightness level of the switched picture are given, the target maximum gray scale brightness of the switched picture may be determined.

Step 130, based on the target maximum gray scale brightness of the switched picture, the first maximum gray scale brightness and the first effective pulse duty cycle, the target effective pulse duty cycle of the EMIT for driving the switched picture is adjusted.

In this embodiment, since the EMIT may change the brightness level of the OLED by adjusting the length of the light-emitting time period of the OLED, and the first maximum gray scale brightness and the first effective pulse duty cycle are given, when the picture of the organic light-emitting display panel is switched, the target effective pulse duty cycle of the EMIT for driving the switched picture may be adjusted based on the determined target maximum gray scale brightness of the switched picture, and enabling the switch picture to reach a target maximum gray scale brightness. In one embodiment, the duty cycle ratio of the target effective pulse duty cycle to first effective pulse duty cycle is determined as the brightness ratio of the target maximum gray scale brightness to the first maximum gray scale brightness, and computing the target effective pulse duty cycle. As a driving timing of the EMIT for driving the switched picture is adjusted by the organic light-emitting display panel in order to conform to the driving timing of the target effective pulse duty cycle, the display brightness of the switched picture is just the target maximum gray scale brightness.

It should be noted that, the gray scales of different sub-pixels for the picture of a frame may be different. As target gray scale of display picture and target maximum gray scale brightness are determined, the data signal voltage outputted to each sub-pixel may be adjusted for the organic light-emitting display panel, and enabling each sub-pixel of the picture of a frame to display the corresponding gray scale. The organic light-emitting display panel provided in present disclosure may achieve a smooth adjustment of 0-255 gray scales within a brightness level by adjusting the data signal voltage.

In this embodiment, it is preset in the organic light-emitting display panel brightness levels, the maximum gray scale brightness corresponding to each of the brightness level, the first maximum gray scale brightness corresponding to the maximum brightness level and the first effective pulse duty cycle of the EMIT for driving the first maximum gray scale brightness. By adjusting the target effective pulse duty cycle of the EMIT for driving the switched picture, a target brightness level is enabled to be adjusted in the organic light-emitting display panel. In this embodiment, the display time period of the organic light-emitting display panel can be adjusted by adjusting the effective pulse duty cycle of the organic light-emitting display panel, and adjusting the total brightness of the organic light-emitting display panel. Furthermore, the driving method for the organic light-emitting display panel may also achieve the smooth adjustment of the brightness of the organic light-emitting display panel and improve the display effect of the organic light-emitting display panel.

Figure 2:
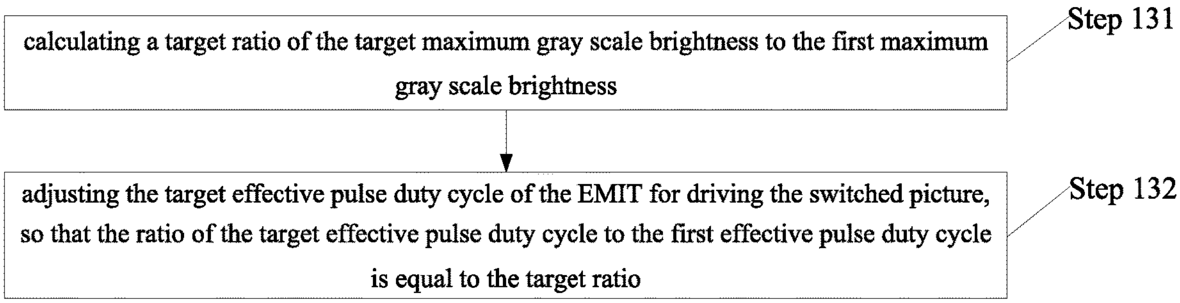
FIG. 2 is a flow diagram showing another driving method for an organic light-emitting display panel according to an embodiment of the present disclosure.

In one embodiment, as shown in FIG. 2, adjusting the target effective pulse duty cycle of the EMIT for driving the switched picture in above mentioned step 130 includes: Step 131, calculating a target ratio of the target maximum gray scale brightness to the first maximum gray scale brightness; and Step 132, adjusting the target effective pulse duty cycle of the EMIT for driving the switched picture, and the ratio of the target effective pulse duty cycle to the first effective pulse duty cycle is equal to the target ratio.

In this embodiment, since the EMIT may change the brightness level of the OLED by adjusting the time period of data signal voltage inputted to the OLED, and the first maximum gray scale brightness and the corresponding first effective pulse duty cycle are given, when controlling the switching of pictures of the organic light-emitting display panel, the target effective pulse duty cycle of the EMIT may be adjusted for driving the switched picture based on the determined target maximum gray scale brightness of the switched picture, and enabling the switch picture to reach a target maximum gray scale brightness.

In one embodiment, a target ratio is obtained by calculating a brightness ratio of the target maximum gray scale brightness to the first maximum gray scale brightness, and then the target effective pulse duty cycle of the EMIT for driving the switched picture is adjusted, and enabling the ratio of the target effective pulse duty cycle to the first effective pulse duty cycle to be equal to a target ratio. The driving for the organic light-emitting display panel is controlled according to the adjusted EMIT, and thus the display brightness of the switched picture is just the target maximum gray scale brightness.

In one embodiment, adjusting the target effective pulse duty cycle of the EMIT for driving the switched picture in step 130 includes: decreasing gradually, when the target effective pulse duty cycle of the EMIT for driving the switched picture is less than the target effective pulse duty cycle of the EMIT for driving the preceding picture of the frame, the target effective pulse duty cycle until the ratio of the target effective pulse duty cycle to the first effective pulse duty cycle is equal to the target ratio.

If the target effective pulse duty cycle of the EMIT after switched is less than that of the EMIT before switched, it indicates that the brightness of the switched picture is lower than that of the picture before switched. Based on the case that the brightness becomes lower before and after the picture switching, the target effective pulse duty cycle of the EMIT for driving the switched picture is decreased. That is, the width of each ineffective pulse is adjusted individually until the ratio of the target effective pulse duty cycle of the EMIT for driving the switched picture to the first effective pulse duty cycle is equal to the target ratio. Therefore, the display time period of the organic light-emitting display panel is reduced, and the brightness is decreased.

In one embodiment, an output waveform of the EMIT includes effective pulses and ineffective pulses. If the effective pulse duty cycles of the EMIT before and after picture switching are almost same, the target effective pulse duty cycle may be adjusted individually to achieve the fine-tuning on the brightness of the organic light-emitting display panel. If the effective pulse duty cycles of the EMIT before and after picture switching are largely different, the width of ineffective pulse may be adjusted to achieve the fast-tuning on the brightness of the organic light-emitting display panel.

In one embodiment, adjusting the target effective pulse duty cycle of the EMIT for driving the switched picture in step 130 includes: increasing gradually, when the target effective pulse duty cycle of the EMIT for driving the switched picture is larger than the target effective pulse duty cycle of the EMIT for driving the preceding picture of the frame, the target effective pulse duty cycle until the ratio of the target effective pulse duty cycle to the first effective pulse duty cycle is equal to the target ratio.

If the target effective pulse duty cycle of the EMIT after switched is larger than that of the EMIT before switched, it indicates that the brightness of the switched picture is higher than that of the picture before switched. In the case that the brightness becomes higher before and after the picture switching, the target effective pulse duty cycle of the EMIT for driving the switched picture is increased. That is, the width of each ineffective pulse is adjusted individually until the ratio of the target effective pulse duty cycle of the EMIT for driving the switched picture to the first effective pulse duty cycle is equal to the target ratio. Therefore, the display time period of the organic light-emitting display panel is increased and the brightness is improved. In one embodiment, the target effective pulse duty cycle may be adjusted to achieve the adjustment to the brightness of the organic light-emitting display panel.

Based on the same inventive concept, the present disclosure further provides a driving device of the organic light-emitting display panel. Since the principle of the driving device for solving the problems is similar to that of the driving method of the organic light-emitting display panel, the operations of the driving device may refer to that of the driving method and do not discuss again here.

Figure 3:
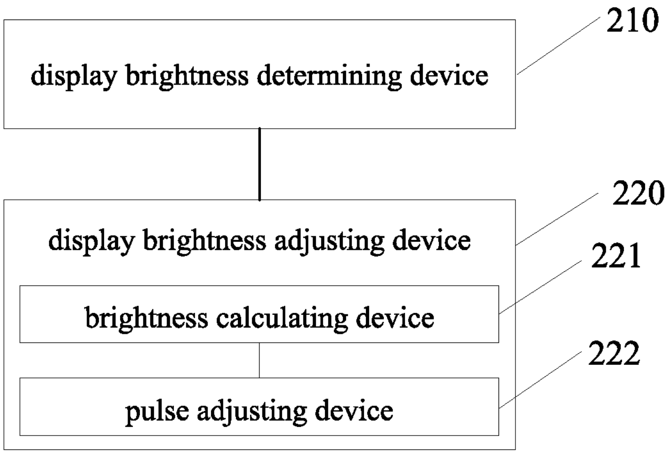
FIG. 3 is a diagram showing a driving device for an organic light-emitting display panel according to an embodiment of the present disclosure.

As shown in FIG. 3, a driving device of the organic light-emitting display panel is provided in this embodiment, the driving device includes: a display brightness determining device 210 and a display brightness adjusting device 220.

The display brightness determining device 210 is configured to determine, when controlling the picture switching of the organic light-emitting display panel, the target brightness level of the switched picture and the target maximum gray scale brightness corresponding to the target brightness level. The display brightness adjusting device 220 is configured to adjust the target effective pulse duty cycle of the EMIT for driving the switched picture on the basis of the target maximum gray scale brightness of the switched picture, the first maximum gray scale brightness and a first effective pulse duty cycle. The maximum gray scale brightness corresponding to the maximum brightness level of the organic light-emitting display panel is defined as a first maximum gray scale brightness, and the effective pulse duty cycle of the EMIT for driving the first maximum gray scale brightness is defined as a first effective pulse duty cycle.

In one embodiment, the effective pulse of the EMIT is configured to control at least one row of sub-pixels to emit light.

In one embodiment, the effective pulse of the EMIT is configured to control the adjacent four rows of sub-pixels to emit light.

In one embodiment, an output waveform of the EMIT includes effective pulses and ineffective pulses.

In one embodiment, the display brightness adjusting device 220 includes: a brightness calculating device 221 and a pulse adjusting device 222.

The brightness calculating device 221 is configured to calculate a target ratio of the target maximum gray scale brightness to the first maximum gray scale brightness; the pulse adjusting device 222 is configured to adjust the target effective pulse duty cycle of the EMIT for driving the switched picture, and enabling the ratio of the target effective pulse duty cycle to the first effective pulse duty cycle to be equal to a target ratio.

In one embodiment, the implementation process for the display brightness adjusting device 220 includes: decreasing gradually, when the target effective pulse duty cycle of the EMIT for driving the switched picture is less than the target effective pulse duty cycle of the EMIT for driving the preceding picture of the frame, the target effective pulse duty cycle of the EMIT until the ratio of the target effective pulse duty cycle to the first effective pulse duty cycle is equal to the target ratio.

In one embodiment, the implementation process for the display brightness adjusting device 220 includes: increasing gradually, when the target effective pulse duty cycle of the EMIT for driving the switched picture is larger than the target effective pulse duty cycle of the EMIT for driving the preceding picture of the frame, the target effective pulse duty cycle of the EMIT until the ratio of the target effective pulse duty cycle to the first effective pulse duty cycle equal to the target ratio.

In this embodiment, the display time period of the organic light-emitting display panel is adjusted by adjusting the effective pulse duty cycle of the organic light-emitting display panel, and adjusting the total brightness of the organic light-emitting display panel. Furthermore, the driving method for the organic light-emitting display panel may also achieve the smooth adjustment of the brightness of the organic light-emitting display panel and improve the display effect of the organic light-emitting display panel.

Based on the same inventive concept, the present disclosure further provides a driving device of the organic light-emitting display panel and the driving device according to any above mentioned embodiments is integrated into the organic light-emitting display panel. The driving device is configured to solve the driving method according to any above mentioned embodiments and no repetitions here.

Figure 4:
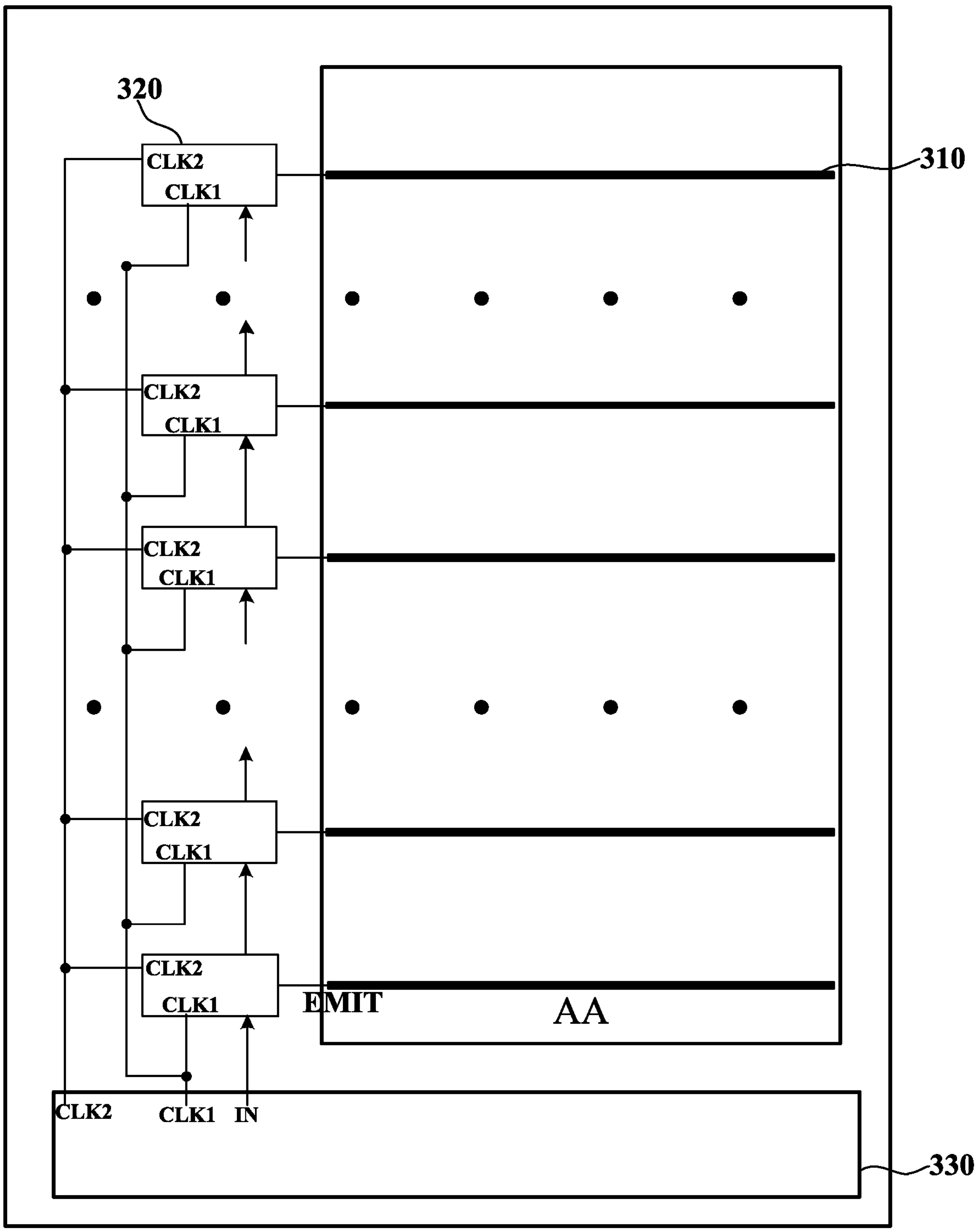
FIG. 4 is a diagram showing an organic light-emitting display panel according to an embodiment of the present disclosure.

In this embodiment, the organic light-emitting display panel shown in FIG. 4 includes the driving device according to above embodiments. In one embodiment, the driving device includes: light-emitting control lines 310, and a light-emitting control line 310 is correspond to and is electrically connected to at least a row of sub-pixels (not shown in drawings); multiple cascades of shift register devices 320, and the multiple cascaded of shift register devices 320 correspond to and are electrically connected to light-emitting control lines, respectively, a cascade of the shift register devices 320 is configured to provide a EMIT to a corresponding light-emitting control line 310.

Figure 5:
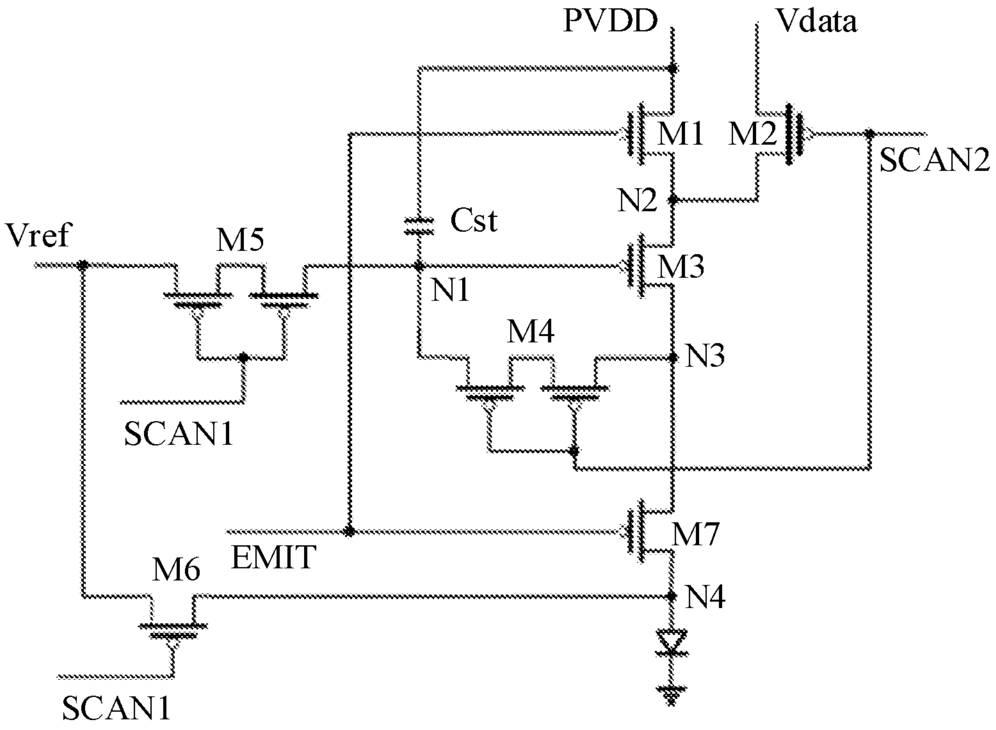
FIG. 5 is a diagram showing a pixel circuit according to an embodiment of the present disclosure.

In this embodiment, the organic light-emitting display panel includes a display region AA, and sub-pixels with array distribution are disposed in the display region AA. The organic light-emitting display panel further includes a non-display region surround the display region AA, and a driving device is provided in the non-display region. Each sub-pixel is controlled by a corresponding pixel circuit, as shown in FIG. 5, the pixel circuit includes a light-emitting control transistor M1 and a light-emitting control transistor M7 for driving the OLED. A light-emitting control line 310 is configured to correspond to and is electrically connected to at least a row of sub-pixels, which indicates that a light-emitting control line 310 is connected to the gate electrode of the light-emitting control transistor in the pixel circuit of at least a row of sub-pixels, and an EMIT is transmitted to the gate electrode of the light-emitting control transistor via the light-emitting control line 310. The pixel circuit further includes a second transistor M2, a light-emitting driving transistor M3, a fourth transistor M4, a fifth transistor M5, a sixth transistor M6 and a storage capacitor Cst. A first initialization control signal line SCAN1 is electrically connected to the gate of the fifth transistor M5 and the gate of the sixth transistor M6. A threshold compensation control signal line SCAN2 is electrically connected to the gate of the second transistor M2 and the gate of the fourth transistor M4, and the fourth transistor M4 and the fifth transistor M5 are dual-gate transistors. The second transistor M2 is a writing transistor, the fourth transistor M4 is a threshold compensation transistor, the fifth transistor M5 is a first initialization transistor, and the sixth transistor M6 is a second initialization transistor.

In this embodiment, the driving device further includes: multiple cascades of shift register devices 320, the multiple cascades of shift register devices 320 are configured to be correspond to and electrically connected to light-emitting control lines 310. each of the cascades of the multiple cascades of shift register devices 320 is configured to provide a EMIT to a corresponding light-emitting control line 310. It should be noted that, the driving device of the organic light-emitting display panel further includes a light-emitting driving chip 330, the light-emitting driving chip 330 is configured to apply a shift trigger signal (IN) to the first cascade of shift register devices 320, and the light-emitting driving chip 330 is also configured to apply a first clock signal CLK 1 and a second clock signal CLK2 to each of the cascades of shift register devices 320. The waveform of the IN outputted by the light-emitting driving chip 330 is same with that of the EMIT, with the merely difference in phases. The shift registers device 320 outputs the EMIT on basis of the shift trigger signal IN outputted by the driving chip 330. The brightness level of the organic light-emitting display panel may adjusted by adjusting the waveform of the shift trigger signal IN by the light-emitting driving chip 330.

When driving device controls the picture switching, the light-emitting driving chip 330 of the driving device may determine the brightness level of the switched picture and maximum gray scale brightness. Since the maximum brightness level, the first maximum gray scale brightness corresponding to the maximum brightness level and the first effective pulse duty cycle are known to the light-emitting driving chip 330, the effective pulse duty cycle of the EMIT of driving the switched picture may be calculated by the light-emitting driving chip 330, and the adjusted EMIT is outputted by adjusting the IN of the EMIT and the multiple cascades of shift register devices 320 based on the calculated effective pulse duty cycle of the EMIT of driving the switched picture.

The organic light-emitting display panel provided by this embodiment has a dimming mode and provides a driving timing for changing the brightness of the organic light-emitting display panel under the dimming mode, and the dimming mode may improve the problems of defective display in the organic light-emitting display panel. Under the dimming mode, the display time period of the organic light-emitting display panel can be adjusted by adjusting the width of the effective pulse duty cycle of the EMIT outputted by the shift registers device 320, and adjusting the brightness of the organic light-emitting display panel.

It should be noted that, the driving device may achieve a desired effective pulse duty cycle by adjusting the width of each pulse of the EMIT, in order to achieve the adjustment for the picture of a frame; and the driving device may also achieve the adjustment of the gray scales for different sub-pixels in the picture of a frame by adjusting the data signal voltage.

In order to describe the driving timing of the organic light-emitting display panel in detail, the driving timing for pictures of multiple frames is taken as an example to give descriptions here. It should be noted that, a display stage of the organic light-emitting display panel includes an initial stage, a data-writing stage and a light emission stage. In one embodiment, the operating timings of the initial stage and the data-writing stage in the organic light-emitting display panel are similar to the related technologies and no repetitions here.

Figure 6A:
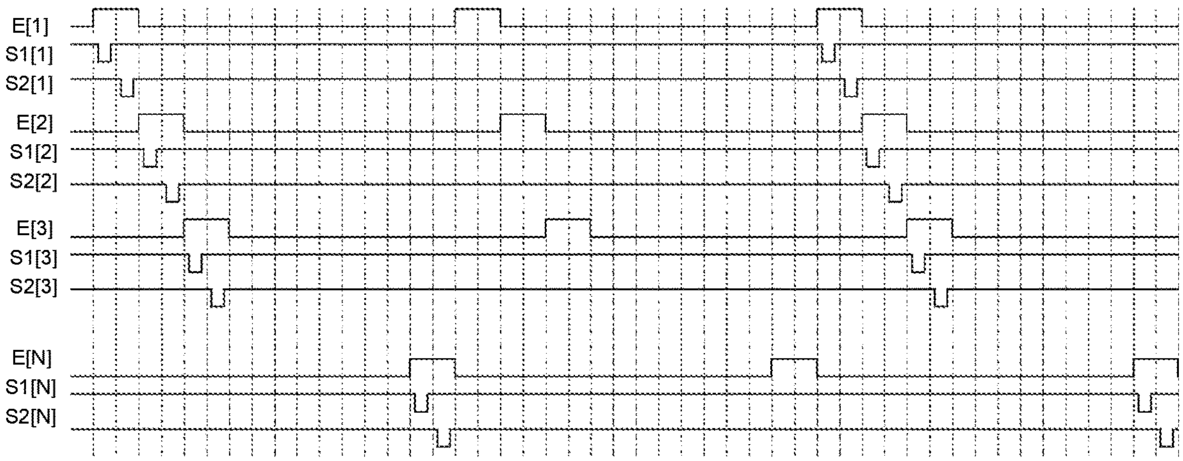
FIG. 6A, FIG. 6B and FIG. 6C are the waveform graphs showing the light-emitting control signal with different brightness levels according to the embodiments of the present disclosure.
Figure 6B:
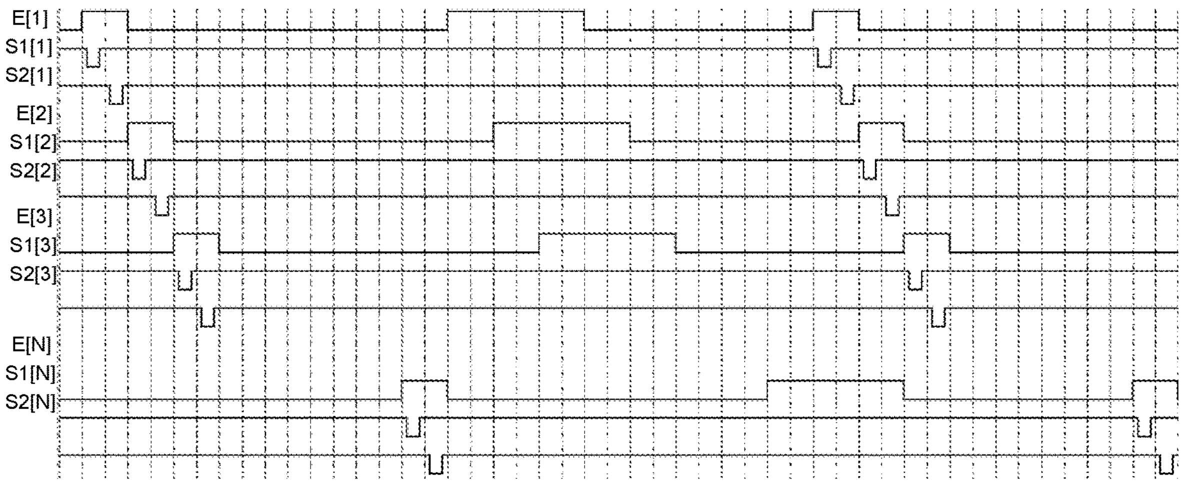
Figure 6C:
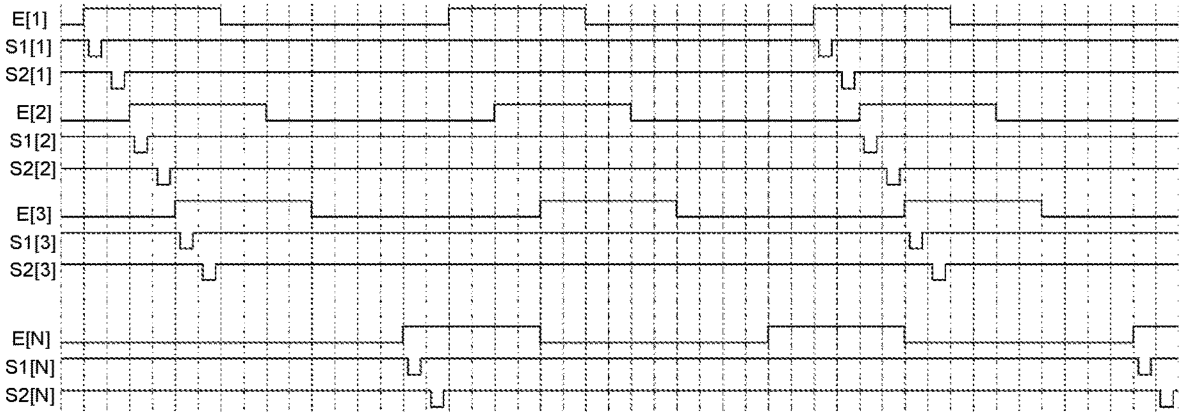

In FIG. 6A, FIG. 6B and FIG. 6C, it should be noted that, the EMIT of the organic light-emitting display panel in the light emission stage includes two pulses; S1 is an initial control line, and the organic light-emitting display panel is in the initial stage when S1 outputs the low level pulses; S2 is a data-writing control line, and the organic light-emitting display panel is in the data-writing stage when S2 outputs the low level pulses. E[1] is the a first light-emitting control line, S1[1] is a first initial control line, and S2[1] is a first data-writing control line and the like.

FIG. 6A shows a waveform of the maximum gray scale brightness corresponding to the 255-th-level brightness of the organic light-emitting display panel, and a high level pulse is the ineffective pulse, and a low level pulse is the effective pulse.

As shown in FIG. 6B, when the brightness level of the organic light-emitting display panel may need to be decreased, the driving device of the organic light-emitting display panel may decrease the brightness level of the organic light-emitting display panel by decreasing the target effective pulse duty cycle of the EMIT. For example, if the brightness level of the organic light-emitting display panel may need to be decreased to the 254-th-level brightness, the brightness level of the organic light-emitting display panel may be decreased by increasing the width of the second ineffective pulse of the EMIT. The specific increased time period may be determined and adjusted according to the maximum gray scale brightness corresponding to the 254-th-level brightness.

As shown in FIG. 6C, when the brightness level of the organic light-emitting display panel may need to be further decreased, the driving device of the organic light-emitting display panel may decrease the brightness level of the organic light-emitting display panel by decreasing the target effective pulse duty cycle of the EMIT. For example, if the brightness level of the organic light-emitting display panel may need to be decreased to the 253-th-level brightness, the brightness level of the organic light-emitting display panel may be decreased by increasing the width of the second ineffective pulse of the EMIT. The specific increased time period may be determined and adjusted according to the maximum gray scale brightness corresponding to the 253-th-level brightness.

The driving device according to this embodiment provides a novel driving timing in the light emission stage of the organic light-emitting display panel, and the adjustment to the display time period of the organic light-emitting display panel is achieved, and hence adjusting the display brightness of the organic light-emitting display panel.

What is claimed is:

1. An organic light-emitting display panel, comprising:

a pixel circuit, wherein pixel circuit comprises a light-emitting driving transistor, a first light-emitting control transistor, a second light-emitting control transistor, an organic light-emitting diode (OLED) and a writing transistor;

a light-emitting control line, wherein the light-emitting control line is configured for transmitting a light-emitting control signal (EMIT);

a writing control line, wherein the writing control line is configured for transmitting a writing control signal; and wherein a first electrode of the first light-emitting control transistor is electrically connected to a power voltage terminal, and a second electrode of the first light-emitting control transistor is electrically connected to a first electrode of the light-emitting driving transistor;

wherein a first electrode of the second light-emitting control transistor is electrically connected to a second electrode of the light-emitting driving transistor, and a second electrode of the second light-emitting control transistor is electrically connected to a first electrode of the OLED, and a first electrode of the writing transistor is electrically connected to the first electrode of the light-emitting driving transistor;

wherein the light-emitting control signal is received by a gate of the first light-emitting control transistor and a gate of the second light-emitting control transistor, and the writing control signal is received by a gate of the writing transistor;

wherein in one display cycle, an output waveform of the light-emitting control signal comprises two first pulse groups connected in sequence, the two first pulse groups have a same width;

wherein one first pulse group of the two first pulse groups comprises two first pulses connected in sequence, one of the two first pulses is a first ineffective pulse, and the other of the two first pulses is a first effective pulse;

wherein in two adjacent first pulses of the two first pulse groups, one of the two adjacent first pulses is the first effective pulse, and the other of the two adjacent first pulses is the first ineffective pulse, and widths of two first ineffective pulses in the two adjacent first pulse groups are different from each other;

wherein an output waveform of the writing control signal comprises second pulse groups connected in sequence, the second pulse group of the second pulse groups comprises two second pulses connected in sequence, one of the two second pulses is a second effective pulse, and the other of the two second pulses is a second ineffective pulse;

wherein a width of the second pulse group is equal to a total sum of widths of the two first pulse groups;

wherein a brightness level of the organic light-emitting display panel comprises a first brightness level and a second brightness level;

wherein in a case where the brightness level is the first brightness level, the first pulse group comprises a first pulse sub-group and a second pulse sub-group adjacent to the first pulse sub-group, and a width of the first pulse sub-group is equal to a width of the second pulse sub-group;

wherein in a case where the brightness level is the second brightness level, the first pulse group comprises a third pulse sub-group and a fourth pulse sub-group adjacent to the third pulse sub-group, and a width of the third pulse sub-group is equal to a width of the fourth pulse sub-group;

wherein the width of the first pulse sub-group is equal to the width of the third pulse sub-group, a width of the first ineffective pulse of the first pulse sub-group is equal to a width of the first ineffective pulse of the third pulse sub-group, and a width of the first ineffective pulse of the second pulse sub-group is not equal to a width of the first ineffective pulse of the fourth pulse sub-group.

2. The organic light-emitting display panel of claim 1, further comprising: a threshold compensation transistor and a threshold compensation control line;

wherein the threshold compensation control line is configured for transmitting a threshold compensation control signal;

wherein a first electrode of the threshold compensation transistor is electrically connected to the second electrode of the light-emitting driving transistor, a second electrode of the threshold compensation transistor is electrically connected to a gate of the of the light-emitting driving transistor, and the threshold compensation control signal is received by a gate of the threshold compensation transistor;

wherein an output waveform of the threshold compensation control signal comprises multiple third pulse groups connected in sequence, one third pulse group of the third pulse groups comprises two third pulses connected in sequence, one of the two third pulses is a third effective pulse, and the other of the two third pulses is a third ineffective pulse;

wherein a width of the third pulse group is equal to a total sum of widths of the two first pulse groups.

3. The organic light-emitting display panel of claim 2, wherein the writing control line is reused as the threshold compensation control line, or the writing control line is electrically connected to the threshold compensation control line.

4. The organic light-emitting display panel of claim 1, further comprising: a first initialization transistor, a first initialization control line and a first initialization line;

wherein the first initialization control line is configured for transmitting a first initialization signal voltage, the first initialization transistor is configured to input the first initialization signal voltage;

wherein a first initialization signal voltage is received by a first electrode of the first initialization transistor, a second electrode of the first initialization transistor is electrically connected to the gate of the of the light-emitting driving transistor, and the first initialization control signal is received by a gate of the first initialization transistor;

wherein an output waveform of a first initialization control signal comprises multiple fourth pulse groups connected in sequence, one fourth pulse group of the fourth pulse groups comprises two fourth pulses connected in sequence, one of the two fourth pulses is a fourth effective pulse, and the other of the two fourth pulses is a fourth ineffective pulse.

5. The organic light-emitting display panel of claim 4, wherein a width of the fourth pulse group is equal to a total sum of widths of the two first pulse groups.

6. The organic light-emitting display panel of claim 4, further comprising: a second initialization transistor, a second initialization control line and a second initialization line;

wherein the second initialization control line is configured for transmitting a second initialization control signal, and the second initialization line is configured for transmitting a second initialization signal voltage;

wherein a second initialization signal voltage is received by a first electrode of the second initialization transistor, a second electrode of the second initialization transistor is electrically connected to the first electrode of the OLED, and the second initialization control signal is received by a gate of the second initialization transistor;

wherein an output waveform of the second initialization control signal comprises multiple fifth pulse groups connected in sequence, one fifth pulse group of the fifth pulse groups comprises two fifth pulses connected in sequence, one of the two fifth pulses is a fifth effective pulse, and the other of the two fifth pulses is a fifth ineffective pulse.

7. The organic light-emitting display panel of claim 6, wherein a width of the fifth pulse group is equal to a total sum of widths of the two first pulse groups.

8. The organic light-emitting display panel of claim 6, wherein the first initialization control line is reused as the second initialization control line, or the first initialization control line is electrically connected to the second initialization control line.

9. The organic light-emitting display panel of claim 6, wherein the first initialization line is electrically connected to the second initialization line.

10. The organic light-emitting display panel of claim 1, wherein the first ineffective pulse of the second pulse sub-group is not overlapped with the second effective pulse of the second pulse sub-group; and wherein the first ineffective pulse of the fourth pulse sub-group is not overlapped with the second effective pulse of the fourth pulse sub-group.

11. The organic light-emitting display panel of claim 2, wherein the threshold compensation transistor comprises a first threshold compensation transistor and a second threshold compensation transistor;

wherein a first electrode of the first threshold compensation transistor is electrically connected to the second electrode of the light-emitting driving transistor, a second electrode of the first threshold compensation transistor is electrically connected to a first electrode of the second threshold compensation transistor, and a second electrode of the second threshold compensation transistor is electrically connected to the gate of the light-emitting driving transistor.

12. The organic light-emitting display panel of claim 4, wherein the first initialization transistor comprises a first initialization sub-transistor and a second initialization sub-transistor;

wherein the first initialization signal voltage is received by a first electrode of the first initialization sub-transistor, a second electrode of the first initialization sub-transistor is electrically connected to a first electrode of the second initialization sub-transistor, a second electrode of the second initialization sub-transistor is electrically connected to the gate of the of the light-emitting driving transistor, and the first initialization control signal is received by both a gate of the first initialization sub-transistor and a gate of the second initialization sub-transistor.

* * * * *